United States Patent
Yang

(10) Patent No.: US 9,851,427 B2
(45) Date of Patent: Dec. 26, 2017

(54) LARGE-CALIBER TELESCOPE NON-LINEAR INTERFERENCE DETECTING AND FILTERING METHOD

(71) Applicant: NANJING INSTITUTE OF ASTRONOMICAL OPTICS & TECHNOLOGY, CHINESE ACADEMY OF SCIENCES, Nanjing (CN)

(72) Inventor: Shihai Yang, Nanjing (CN)

(73) Assignee: NANJING INSTITUTE OF ASTRONOMICAL OPTICS & TECHNOLOGY, CHINESE ACADEMY OF SCIENCES (CN)

( * ) Notice: Subject to any disclaimer, the term of this patent is extended or adjusted under 35 U.S.C. 154(b) by 403 days.

(21) Appl. No.: 14/426,214

(22) PCT Filed: Jun. 25, 2013

(86) PCT No.: PCT/CN2013/077909
§ 371 (c)(1),
(2) Date: Mar. 5, 2015

(87) PCT Pub. No.: WO2014/008810
PCT Pub. Date: Jan. 16, 2014

(65) Prior Publication Data
US 2015/0276912 A1    Oct. 1, 2015

(30) Foreign Application Priority Data
Jul. 13, 2012 (CN) .......................... 2012 1 0244509

(51) Int. Cl.
*G01R 35/00* (2006.01)
*G02B 23/00* (2006.01)
(Continued)

(52) U.S. Cl.
CPC .............. *G01R 35/00* (2013.01); *G02B 23/00* (2013.01); *G02B 23/16* (2013.01); *G02B 27/646* (2013.01)

(58) Field of Classification Search
CPC combination set(s) only.
See application file for complete search history.

(56) References Cited

U.S. PATENT DOCUMENTS

| 6,995,846 B2* | 2/2006 | Kalayeh | G01N 21/31 250/338.5 |
| 2007/0041075 A1* | 2/2007 | Gupta | G01J 3/02 359/285 |
| 2014/0133011 A1* | 5/2014 | Schwedt | G02B 21/0032 359/298 |

FOREIGN PATENT DOCUMENTS

| CN | 1912550 A | 2/2007 |
| CN | 102519573 A | 6/2012 |

OTHER PUBLICATIONS

International Search Report; PCT/CN2013/077909; International Filing Date: Jun. 25, 2013; 2 pgs.

* cited by examiner

*Primary Examiner* — Mamadou Diallo
(74) *Attorney, Agent, or Firm* — Schmeiser, Olsen & Watts, LLP

(57) ABSTRACT

A large-caliber telescope non-linear interference detecting and filtering method is provided. The measure of the oil pad interference is accomplished with one of the following two methods, accelerometer and encoder, or using both of the said methods simultaneously. The filtering of the oil pad interference: set a NOTCH frequency as the main interfering frequency by using NOTCH filter to filter the interference and distinctly improve the telescope performance. The telescope and method is specific to a large-caliber telescope with (Continued)

an oil pad, by using an acceleration sensor and an encoder to precisely measure the non-linear interfering frequency of the telescope oil pad system, by using a NOTCH digital filter to accurately filter the interference due to the oil pad system, and through adjusting parameters of the digital filter to change the filter frequency band on the basis of the change of the oil pad interfering frequency.

8 Claims, 5 Drawing Sheets

(51) Int. Cl.
  *G02B 23/16* (2006.01)
  *G02B 27/64* (2006.01)

LARGE-CALIBER TELESCOPE NON-LINEAR INTERFERENCE DETECTING AND FILTERING METHOD

CROSS-REFERENCE TO RELATED APPLICATIONS

This application claims priority to PCT Application No. PCT/CN2013/077909, having a filing date of Jun. 25, 2013, based on Chinese Application No. 201210244509.1 filed on Jul. 13, 2012, the entire contents of which are hereby incorporated by reference.

FIELD OF TECHNOLOGY

The following is about the interference detection and filtering for the control system of an astronomical telescope, specifically about the non-linear interference detecting and filtering method for a large-caliber telescope.

BACKGROUND

In most cases, static pressure bearings are used for the main shaft of a large-caliber astronomical telescope (especially azimuth shaft), hydraulic oil is injected between a pair of smooth surfaces, to form a pressure oil membrane to support the load, and also to lubricate the bearing surfaces. It has the advantages that the bearing lubricating surfaces feature high rigidity, long service life and low start power, able to carry very high load with small dynamic and static friction variations. This whole system is referred to as an oil pad system. The pressure of the oil membrane is produced by the hydraulic pump. The oil flow varies cyclically during the suction and compression cycles of the hydraulic pump, and this flow pulsation produces a pulsation in pressure when it encounters impedance in the system. Finally, it results in hydraulic vibration and it spreads to the whole telescope system via the outlet.

In the extra-low speed operation of the main shaft system of the large astronomical telescope, this non-linear interference of the oil pad vibration produces a fairly obvious impact, resulting in unstable tracking speed and reduced tracking precision. Normally mechanical means is used as a solution in the design, erection and commissioning the oil pad system: (A) reducing the oil trap in the plunge pump, using gear with as many teeth and as low modulus as possible in the gear pump, and reasonably designing the unloading slot shape and dimensions in the pump covers on both sides to minimize oil trap, to reduce pressure fluctuation. (B) Preventing air pocket in the pump by using a suction pipe with a bigger diameter to reduce local clogging in the piping. (C) Avoiding bending and deformation of hydraulic cylinder piston rod or over-tightening oil seal, to avoid noise due to journal blocking in the movement. However, the adjusted oil pad usually still produces some vibration, which in some cases directly results in failure of the telescope tracking precision to meet the specification. In this case, two methods are usually adopted because the cost is quite high to re-design or transform the oil pad: (1) increasing the system rigidity with the telescope control system to suppress the disturbance, and the normal practice includes increasing the control gain for the position ring or speed ring. However, this will increase the closed loop band width, making it more easily affected by interference, and also affecting the system stability. (2) Using a pulsing attenuator, or hydraulic filter. Commonly used hydraulic filters include resonance type, cavity type, resistive type and compound type. A resonance type filter features good filtering characteristics at and close to its resonance point, and is suitable to pressure pulsation with constant frequency, therefore the filtering band width is narrow; the cavity filter is a low-pass filter, suitable in eliminating pulsation over the medium frequency, but not suitable to low frequency, as its structure will be excessively big when the filtering frequency is lowered; the resistive filter does not work to either flow pulsation or pressure pulsation, with big pressure loss, therefore its application is limited; a compound filter can produce a better filtering effect than a single one, but the pressure loss is high through multiple stages, and a big structure is required. The disadvantages of using a pulsation attenuation device is: (a) hydraulic filters are expensive. (b) Such a filter can effectively reduce pulsation if the hydraulic pump speed is constant or varies in a small range. If the hydraulic pump speed varies over a large range, the oil pad vibration band will shift, this filter cannot work and another filter for the suitable bank must be used instead.

The impact from the hydraulic system to the telescope is transmitted to the telescope position feedback scale, so its position, speed and acceleration parameters include the oil pad vibration component, seriously affecting the precision of the telescope when tracking celestial bodies.

SUMMARY OF THE INVENTION

An aspect relates to a detecting and filtering method for large-caliber telescope non-linear interference, to precisely measure the interference frequency of the telescope oil pad system, for which a NOTCH digital filter is used to accurately filter the interference due to the oil system, and through adjusting the parameters of the digital filter frequency band on the basis of the change of the oil pad interfering frequency, the filter frequency band can be changed. The said method is flexible and simple.

To solve the technical issue as described above, the method in embodiments of the invention includes:
(1) Determination of the oil pad interference by using the accelerometer method or encoder method.

The steps in the accelerometer method (acceleration sensor method) are:
(1)-1. Set an accelerometer (acceleration sensor) at the base of the telescope azimuth shaft; and set another accelerometer at the gear oil diverter of the oil pad;
(1)-2. The signals of the two said accelerometers are input into the industrial personal computer via the AD adaptor card;
(1)-3. When the oil pad is turned off and the telescope is static, measure the signals of the two said accelerometers and plot the acceleration vs frequency curve;
(1)-4. When the oil pad is turned on and the telescope is static, measure the mentioned signals of the two said accelerometers and plot the acceleration vs frequency curve;
(1)-5. The oil pad vibration interference frequency can be obtained by comparing the acceleration frequency curves in steps (3) and (4).

As the interference at very low frequency cannot be measured accurately and even cannot be detected with the accelerometer method, the encoder method can be used at the same time for comparison and verification, with the steps as follows:
(1)-1. Use a photoelectrical encoder as the position sensor on the azimuth shaft of the telescope;
(1)-2. The signal of this encoder is input into the industrial personal computer via the encoder acquisition card;

(1)-3. Measure the signal from the photoelectrical encoder with the oil pad turned off and the telescope static, make continuous sampling for a period of time, and plot the encoder data curve (or the telescope position curve) and the FFT fast Fourier transformation curve;

(1)-4. Measure the signal from the photoelectrical encoder with the oil pad turned on and the telescope static, make continuous sampling for a period of time, and plot the encoder data curve and the FFT fast Fourier transformation curve;

(1)-5. The oil pad vibration interference frequency can be obtained by comparing the acceleration curve with the FFT (fast Fourier transformation curve); these two methods can be used either separately or together, to verify each other.

(2) To filter the pad interference, the method is as follows:

With the method in step (1) above, the interference frequency of the oil pad on the telescope control system has been obtained, there can be one or more frequencies, and the main interference frequency in them can be found on the FFT frequency spectrum. The telescope test has proved that it has the biggest influence on the tracking precision and performance of the telescope. By using the NOTCH filter and set the NOTCH frequency at the main interference frequency obtained in this step (1), the interference can be filtered to obviously improve the telescope performance. In embodiments of the invention, a NOTCH filter is used to eliminate the effect of resonance in the system. The frequency response formula of an ideal NOTCH filter is:

$$|H(e^{j\omega})| = \begin{cases} 1, & \omega \neq \omega_0 \\ 0, & \omega = \omega_0 \end{cases} \quad (1)$$

The time domain transfer function of the NOTCH filter is:

$$G(s) = \frac{s^2 + 2\zeta_z \omega_{nz} s + \omega_{nz}^2}{s^2 + 2\zeta_p \omega_{np} s + \omega_{np}^2} \quad (2)$$

Where, $\omega_{nz}$ is the natural frequency at zero point, $\zeta_z$ the damping coefficient at zero point, $\omega_{np}$ the natural frequency at extreme point, and $\zeta_p$ the damping coefficient at extreme point.

A NOTCH filter is an infinite impact response (IIR) digital filter, which can be expressed using the following constant coefficient linear differential equation:

$$y(n) = \sum_{i=0}^{M} a_i x(n-i) - \sum_{i=1}^{N} b_i y(n-i) \quad (3)$$

Where x(n) and y(n) are respectively input and output signal series, and $a_i$ and $b_i$ the filter coefficients.

Perform Z conversion on both sides of formula (3), and by converting the S plane into the Z plane of the NOTCH filter, the transfer function of the digital filter is obtained:

$$H(z) = \frac{\sum_{i=0}^{M} a_i z^{-i}}{\sum_{i=0}^{N} b_i z^{-i}} = \frac{\prod_{i=1}^{M}(z-z_i)}{\prod_{i=1}^{N}(z-p_i)} \quad (4)$$

Where, $z_i$ and $p_i$ are respectively the zero points and extreme points of the transfer function.

Further, the NOTCH filter expression can be written as $$\frac{N(z)}{D(z)} = \frac{1 + n_1 z^{-1} + n_2 z^{-2}}{1 + d_1 z^{-1} + d_2 z^{-2}} \quad (5)$$

Where, N(z) is a band eliminating filter, D(z) a band-pass filter, $n_1$ and $n_2$ are respectively the parameters of the band eliminating filter N(z), and $d_1$ and $d_2$ are respectively the parameters of the band-pass filter D(z). The digital NOTCH filters in this form have the characteristics that: the zero points and extreme points of the transfer function match with each other, in this way, except the NOTCH frequency, no other frequency component is affected. If the designed transfer function zero is close to or at the unit circle, the depth of its NOTCH trap can be infinite. To ensure the stability of the filter, the extremes are configured within the unit circle. When the extreme point is closer to the unit circle, it can offset the zero point more strongly, the NOTCH eliminating band becomes narrower and the transition band steeper.

The disadvantage of a too wide NOTCH bandwidth is that the NOTCH band eliminating characteristic curve is not steep enough, with fairly high distortion of useful signal. The disadvantage of a too narrow NOTCH bandwidth is: although the band eliminating characteristics are steep, it is possible that the whole narrow bank interference cannot be fully filtered. As the actual oil pad vibration frequency will change, a filter should have a suitable NOTCH width, to ensure sufficient attenuation of signals of corresponding frequency.

The frequency response is at the extreme low value at zero point, and extreme high value at extreme point. Therefore a NOTCH digital filter can be designed by configuring zero and extreme points according to the required frequency response. A depression is designed at interference frequency, when the extreme point is closer to the unit circle, the depression on the frequency response curve is deeper and the depression is narrower.

The specific method to obtain the parameters is as follows:

Set a band eliminating filter, the natural frequency $\omega_{nz}$ is taken as the interference frequency to be filtered, Ts is the closed loop sampling cycle of the telescope servo system, the damping coefficient $\zeta z$ is selected according to the simulation and experimental result, and normally a number of trial fitting is required to obtain a satisfactory result, according to experience, light damping can be selected for the telescope oil pad system interference. For the natural frequency $\omega_{nz}$ and damping coefficient $\zeta z$ of a band-pass filter, a number of trial fitting is also required according to the simulation and experimental result, and according to experience, heavy damping can be selected for the telescope oil pad system interference. The parameters in formula (5) can be obtained using the formula below:

$$\alpha_z = 1 + 2\zeta_z \omega_{nz} T_s + \omega_{nz}^2 T_s^2 \quad (6)$$

$$\alpha_p = 1 + 2\zeta_p \omega_{np} T_s + \omega_{np}^2 T_s^2 \quad (7)$$

$$n_1 = -\frac{2\zeta_z \omega_{nz} T_s + 2}{\alpha_z} \quad (8)$$

-continued $$n_2 = \frac{1}{\alpha_z} \quad (9)$$

$$d_1 = -\frac{2\zeta_p \omega_{np} T_s + 2}{\alpha_p} \quad (10)$$

$$d_2 = \frac{1}{\alpha_p} \quad (11)$$

Embodiments of the invention is a result of "research on low temperature non-linear interference compensation in low speed high precision tracking by large-caliber astronomical optical telescope at Antarctic", a project of national natural science foundation. The advantage (beneficial result) is that embodiments of the invention can accurately measure the interference frequency of the oil pad system on the telescope, and greatly attenuate the signal near the oil pad vibration response frequency, while the other parts are almost not affected. In this way, the NOTCH filter can suppress the signals in the desired frequency bands, without affecting the telescope tracking performance in other bands of the system. In addition to eliminating the liquid pressure vibration effect in oil pad, the use of NOTCH filter can also increase the rigidity of the closed loop system without affecting the system stability. This method can flexibly change the filtering frequency, and method can be realized in a simple way, with a very high value of practical use.

BRIEF DESCRIPTION

Some of the embodiments will be described in detail, with reference to the following figures, wherein like designations denote like members, wherein:

FIG. 2 is acceleration and frequency correlation curve when the oil pad is turned on;

FIG. 5 is encoder data curve when the oil pad is turned on;

FIG. 6 is encoder data FFT curve when the oil pad is turned on;

DETAILED DESCRIPTION

Embodiment 1, Large-Caliber Telescope Non-Linear Interference Detecting and Filtering Method In the following, embodiments of the invention are further described in conjunction with attached drawings and embodiment.

Figure 1:
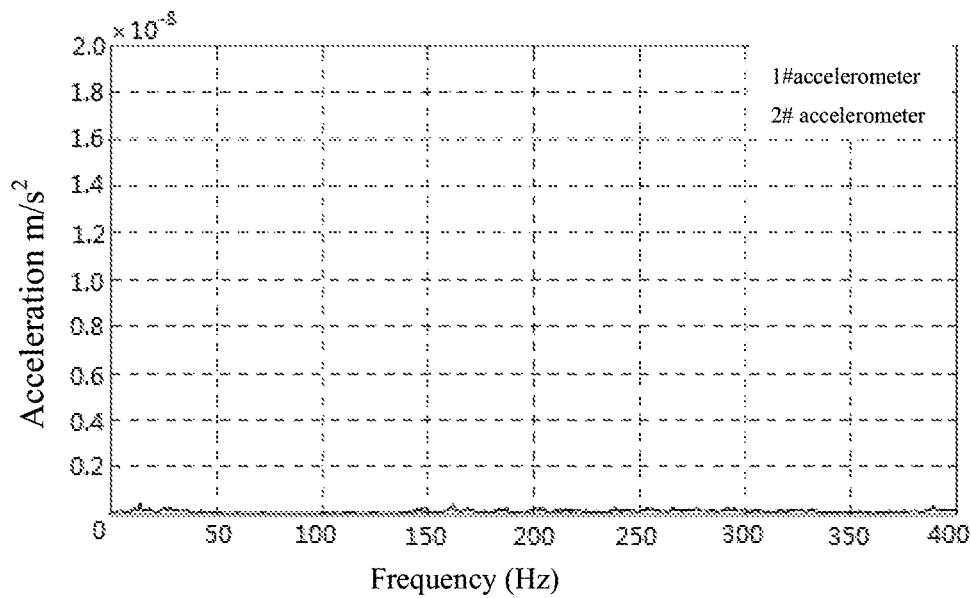
FIG. 1 is acceleration and frequency correlation curve when the oil pad is turned off.
Figure 2:
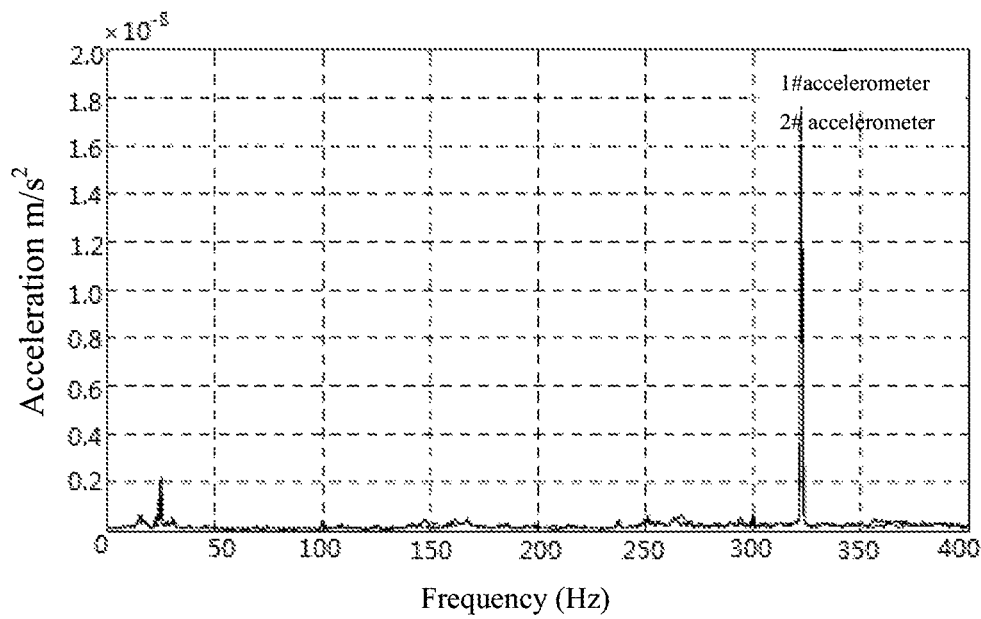

Two acceleration sensors are respectively set at the base of the telescope azimuth shaft and the gear oil diverter of the oil pad of a telescope with a caliber of 2.5 m. The signal of the accelerometer is input into the UMAC movement controller via the AD control card ACC-28E+OPT-1, and fed into the industrial personal computer via the Ethernet bus. When the oil pad is turned off and the telescope is static, the signals of the two accelerometers are measured and the acceleration vs frequency curve is plotted, as shown in FIG. 1. When the oil pad is turned on and the telescope is static, the signals of the two accelerometers are measured and the speed vs frequency curve is plotted, as shown in FIG. 2. It can be found by comparing the curves in the two diagrams that, after the oil pad is turned on, vibration peak occurs at the frequencies of 24.75 Hz and 322 Hz on the telescope azimuth shaft platform vibration curve. This shows that the vibration at this frequency band has transferred to the base on the azimuth shaft turn table.

Figure 3:
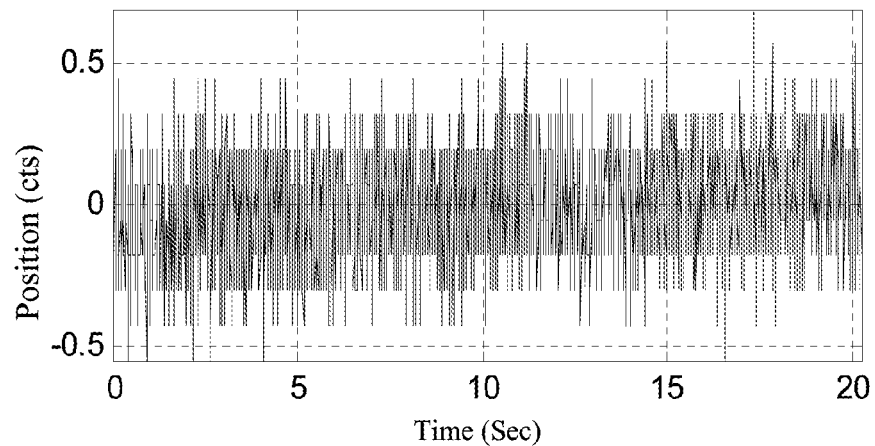
FIG. 3 is encoder data curve when the oil pad is turned off.
Figure 4:
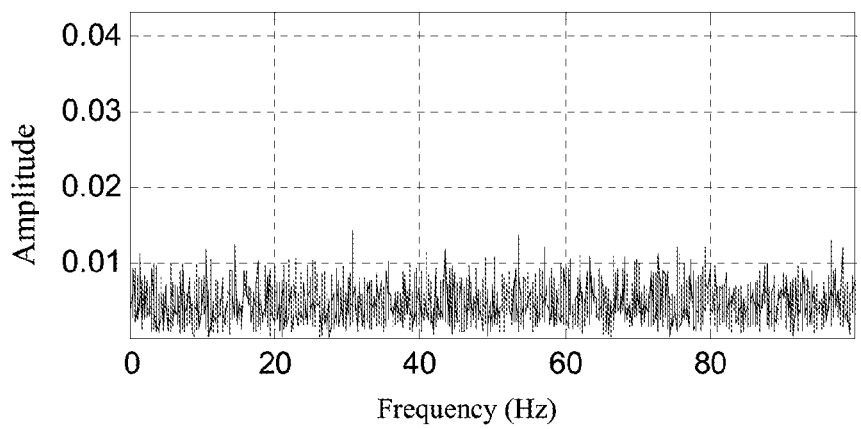
FIG. 4 is encoder data FFT curve when the oil pad is turned off.
Figure 5:
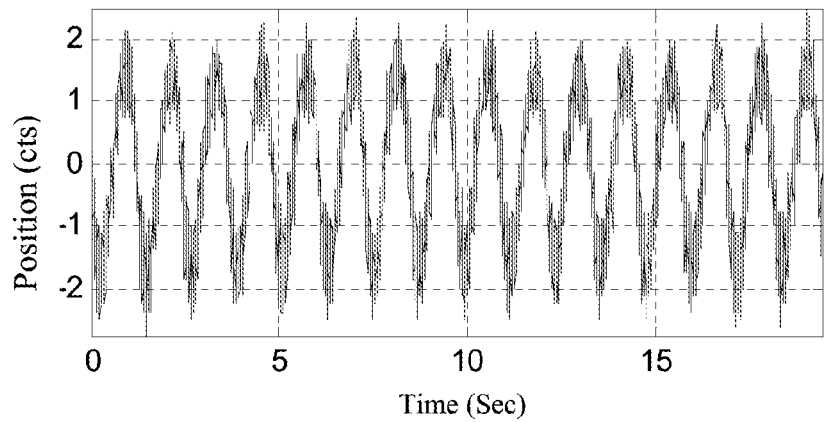
Figure 6:
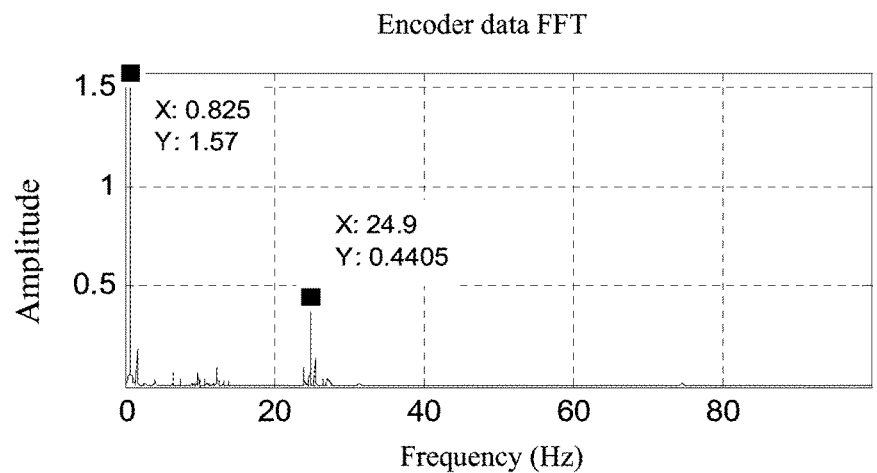

Comparison and verification was done further with encoder method. A photoelectrical encoder is used as the position sensor at the telescope azimuth shaft, its signal is input into the UMAC movement controller via the ACC-51E card, and fed into the industrial personal computer via the Ethernet bus. Measure the signal from the photoelectrical encoder with the oil pad turned off and the telescope static, make continuous sampling for a period of time, and plot the encoder data curve (or the telescope position curve) as shown in FIG. 3 and the FFT fast Fourier transformation curve, as shown in FIG. 4. Collect encoder data for analysis with the oil pad turned on and the telescope static, as shown in FIG. 5, and use the FFT method to convert it from time domain signal into frequency domain signal for frequency spectrum analysis, as shown in FIG. 6. Compare the acceleration curve and FFT fast Fourier transformation curve, when the oil pad is turned on, the encoder data fluctuation increases, PV=5 cts, with strong fluctuating cycles, from which frequency response of 0.825 Hz and 24.75 Hz can be read, however, no frequency peak of 322 Hz occurs. This difference shows that the vibration of 322 Hz only reached the platform of azimuth shaft, but the measuring element is at a location not sensitive to this vibration, and the encoder reading is not affected, that is, the vibration does not enter the control circuit, therefore the control system does not produce a control signal of this frequency, and it will not make the actuator to produce the control force corresponding to 322 Hz.

Figure 7:
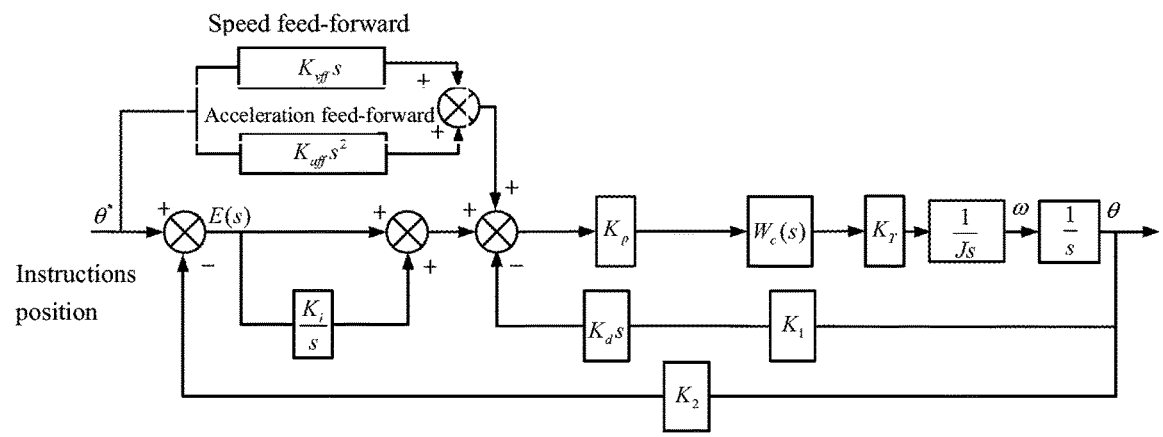
FIG. 7 is block diagram of telescope control system.

In the following, a NOTCH digital filter is used to filter off the most important interference in the oil pad system, its frequency being 0.825 Hz. The original block diagram of the control system is as shown in FIG. 7.

The sampling cycle is $T_s$=0.005 s, as the response frequency measured in this system under oil pad interference $\omega$=0.825 Hz, i.e. the signal of 0.825 Hz hoped to be filtered is the filter center frequency. Set a light damping band eliminating filter, with natural frequency $\omega_{nz}$=0.825 Hz=$2\pi$*0.825=5.1836 rad/s, and closed loop sampling cycle for the servo system, with damping coefficient $\zeta_z$=0.04; and a heavy damping band pass filter, $\omega_{np}$=0.1425 Hz=0.1425*$2\pi$=8.9535 rad/s, with damping coefficient $\zeta_z$=0.8.

$$\alpha_z = 1 + 2\zeta_z \omega_{nz} T_s + \omega_{nz}^2 T_s^2 = 1.0027 \quad (12)$$

$$\alpha_P = 1 + 2\zeta_P \omega_{np} T_s + \omega_{np}^2 T_s^2 = 1.0736 \quad (13)$$

$$n_1 = -\frac{2\zeta_z \omega_{nz} T_s + 2}{\alpha_z} = -1.9966 \quad (14)$$

$$n_2 = \frac{1}{\alpha_z} = 0.9973 \quad (15)$$

$$d_1 = -\frac{2\zeta_p \omega_{np} T_s + 2}{\alpha_p} = -1.9296 \quad (16)$$

-continued $$d_2 = \frac{1}{\alpha_p} = 0.9314 \qquad (17)$$

Therefore we obtain $$\frac{N(z)}{D(z)} = \frac{1 + n_1 z^{-1} + n_2 z^{-2}}{1 + d_1 z^{-1} + d_2 z^{-2}} = \frac{1 - 1.9966 z^{-1} + 0.9973 z^{-2}}{1 - 1.9296 z^{-1} + 0.9314 z^{-2}} \qquad (18)$$

The original proportional gain must be multiplied by the reciprocal of the DC gain of the NOTCH filter, to maintain the rigidity of the whole filter. The new proportional gain is equal to the gain of NOTCH filter divided by the original proportional gain.

$$P_{new} = P \frac{\omega_{np}^2}{\omega_{nz}^2} \frac{\alpha_z}{\alpha_p} = \frac{8.9535^2}{5.1836^2} \frac{1.0027}{1.0736} P = 2.786 P \qquad (19)$$

Figure 8:
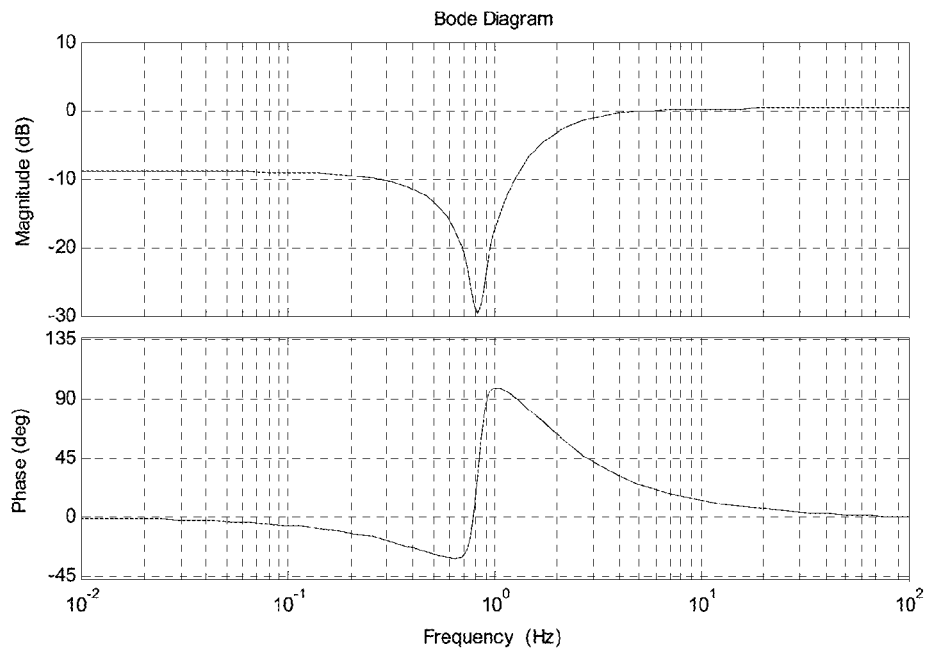
FIG. 8 is BODE diagram of NOTCH filter.
Figure 9:
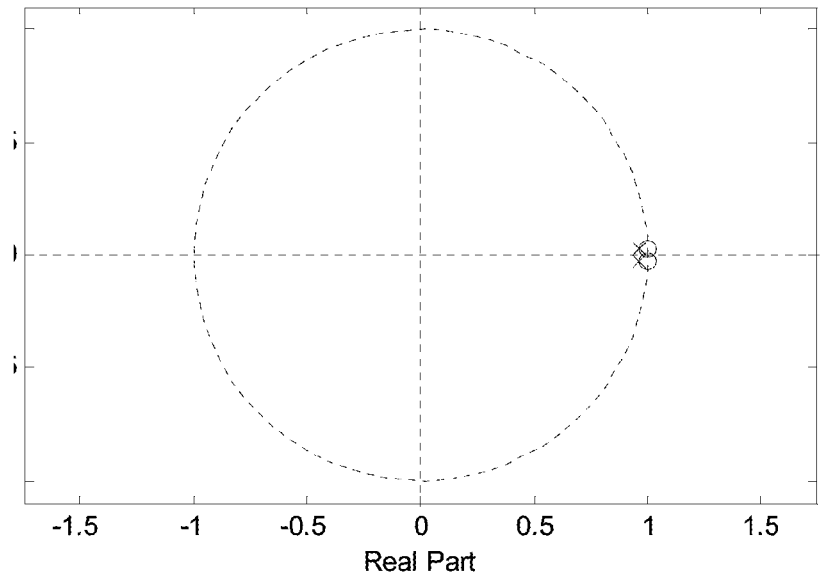
FIG. 9 is Zero extreme point diagram of NOTCH filter.

The BODE diagram of this NOTCH filter is as shown in FIG. 8, and the zero point diagram of the NOTCH filter is as shown in FIG. 9, it can be seen that the zero point and extreme point of the digital NOTCH filter are in conjugate symmetric distribution, and all extreme points are within the unit circle, the zero point is 0.9983±0.0258i and the extreme point 0.9648±0.0250i, meeting the system stability requirements.

Figure 10:
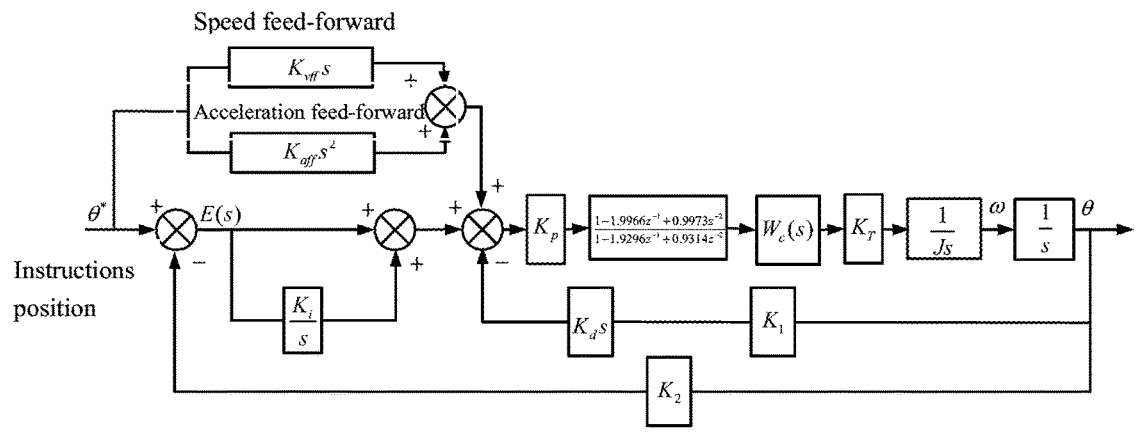
FIG. 10 is Block diagram of telescope control system with the NOTCH added.
Figure 11:
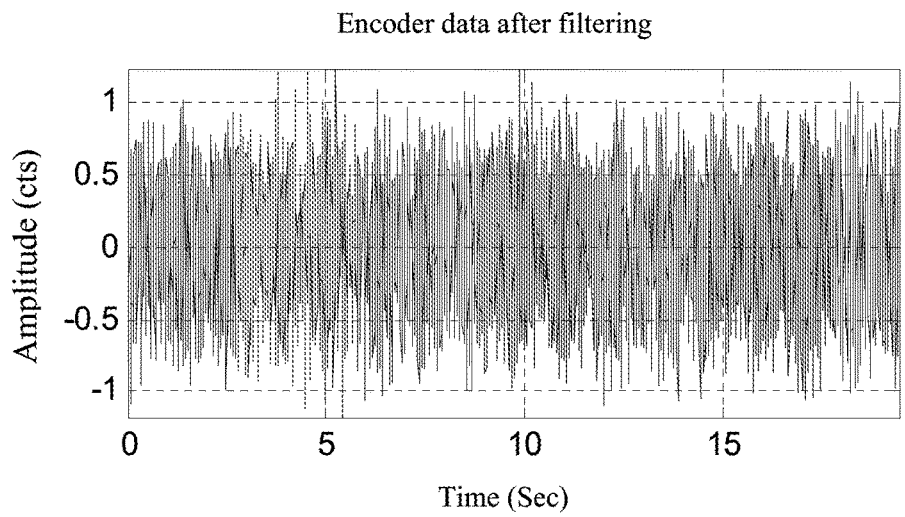
FIG. 11 is Encoder data curve after NOTCH filtering.
Figure 12:
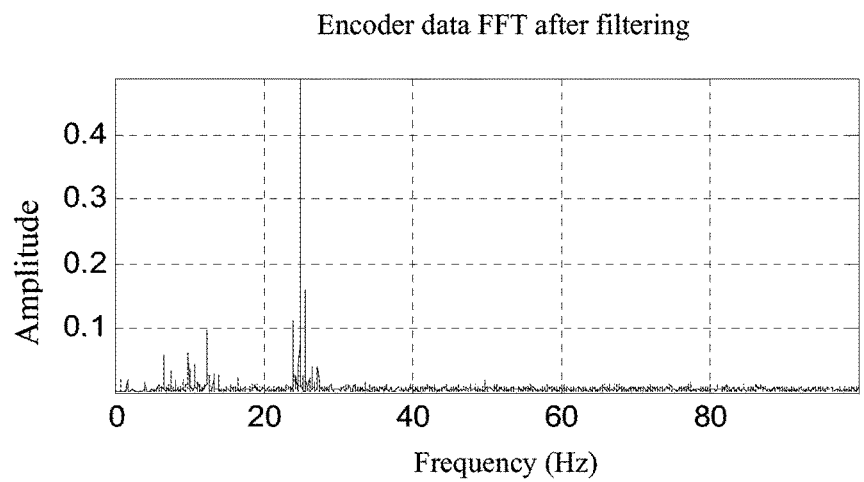
FIG. 12 is Encoder data FFT curve after NOTCH filtering.

Add the designed NOTCH filter, the block diagram of the telescope control system is as shown in FIG. 10. The effect of using this filter is as shown in FIGS. 11 and 12.

It can be seen that the method used in embodiments of the invention is an ideal method to remove the oil pad vibration narrow band interference, and it eliminates the narrow band interference without producing attenuation to other frequencies.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method to detect and filter large-caliber telescope non-linear interference, the method comprising the following steps:
   (1) determining if an oil pad interference is accomplished with one or both of an accelerometer method and an encoder method;
   wherein, the accelerometer sensor method includes:
   (1)-1. setting an accelerometer at a base of a telescope azimuth shaft; and setting an additional accelerometer at a gear oil diverter of an oil pad;
   (1)-2. inputting signals of the accelerometer and the additional accelerometer into an industrial personal computer via an AD adaptor card;
   (1)-3. wherein, when the oil pad is turned off and the telescope is static, measuring the signals of the accelerometer and the additional accelerometer and plotting an acceleration vs frequency curve;
   (1)-4. wherein, when the oil pad is turned on and the telescope is static, measuring the signals of the accelerometer and the additional accelerometer and plotting an acceleration vs frequency curve;
   (1)-5. obtaining the oil pad vibration interference frequency by comparing the acceleration vs. frequency curve of step (1)-3 and the acceleration vs. frequency curve of step (1)-4;
   wherein the encoder method includes:
   (2)-1. using a photoelectrical encoder as a position sensor on the telescope azimuth shaft;
   (2)-2. inputting a signal of the photoelectrical encoder into the industrial personal computer via a photoelectrical encoder acquisition card;
   (2)-3. measuring the signal from the photoelectrical encoder with the oil pad turned off and the telescope static, continuously sampling for a period of time, and plotting an encoder data curve and a FFT (fast Fourier transformation) curve;
   (2)-4. measuring the signal from the photoelectrical encoder with the oil pad turned on and the telescope static, continuously sampling for a period of time, and plotting an encoder data curve and a FFT curve;
   (2)-5. obtaining the oil pad vibration interference frequency by comparing the acceleration curve and the FFT (fast Fourier transformation) curve;
   (3) filtering the oil pad interference frequency:
   by using a NOTCH filter and setting a NOTCH frequency at the interference frequency obtained in step (1), the interference being filtered to improve performance of the telescope.

2. The method to detect and filter large-caliber telescope non-linear interference according to claim 1, wherein the specific method to obtain parameters is: setting a band eliminating filter, taking a natural frequency $\omega_{nz}$ as the interference frequency to be filtered, $T_s$ being a closed loop sampling cycle of the telescope servo system, and a damping coefficient $\zeta_z$ selected according to the simulation and experimental result.

3. The method to detect and filter large-caliber telescope non-linear interference according to claim 2, wherein light damping is selected for the telescope oil pad system interference.

4. The method to detect and filter large-caliber telescope non-linear interference according to claim 2, wherein, with the natural frequency $\omega_{np}$ and the damping coefficient $\zeta_z$ of a band-pass filter, heavy damping is selected for the telescope oil pad system interference.

5. The method to detect and filter large-caliber telescope non-linear interference according to claim 2, wherein a frequency response formula of the NOTCH filter is:

$$|H(e^{j\omega})| = \begin{cases} 1, & \omega \neq \omega_0 \\ 0, & \omega = \omega_0 \end{cases} \qquad (1)$$

The time domain transfer function of the NOTCH filter is:

$$G(s) = \frac{s^2 + 2\zeta_z \omega_{nz} + \omega_{nz}^2}{s^2 + 2\zeta_p \omega_{np} + \omega_{np}^2} \qquad (2)$$

where, $\omega_{nz}$ is the natural frequency at zero point, $\zeta_z$ the damping coefficient at zero point, $\omega_{np}$ the natural frequency at extreme point, and $\zeta_p$ the damping coefficient at extreme point.

6. The method to detect and filter large-caliber telescope non-linear interference according to claim 5, wherein the NOTCH filter is expressed with the following constant coefficient linear differential equation:

$$y(n) = \sum_{i=0}^{M} a_i x(n-i) - \sum_{i=1}^{N} b_i y(n-i) \tag{3}$$

where x(n) and y(n) are respectively input and output signal series, and $a_i$ and $b_i$ the filter coefficients;

performing Z conversion on both sides of formula (3), and by converting the S plane into the Z plane of the NOTCH filter, the transfer function of the digital filter is obtained:

$$H(z) = \frac{\sum_{i=0}^{M} a_i z^{-i}}{\sum_{i=0}^{N} b_i z^{-i}} = \frac{\prod_{i=1}^{M}(z-z_i)}{\prod_{i=1}^{N}(z-p_i)} \tag{4}$$

where, $z_i$ and $p_i$ are respectively the zero points and extreme points of the transfer function.

7. The method to detect and filter large-caliber telescope non-linear interference according to claim 6, wherein the expression of the NOTCH filter is written as:

$$\frac{N(z)}{D(z)} = \frac{1+n_1 z^{-1}+n_2 z^{-2}}{1+d_1 z^{-1}+d_2 z^{-2}} \tag{5}$$

where, N(z) is a band eliminating filter, D(z) is a band-pass filter, $n_1$ and $n_2$ are respectively the parameters of the band eliminating filter N(z), and $d_1$ and $d_2$ are respectively the parameters of the band-pass filter.

8. The method to detect and filter large-caliber telescope non-linear interference according to claim 6, wherein the parameters in the formula (5) are obtained using the formula below:

$$\alpha_z = 1 + 2\zeta_z \omega_{nz} T_s + \omega_{nz}^2 T_s^2 \tag{6}$$

$$\alpha_p = 1 + 2\zeta_p \omega_{np} T_s + \omega_{np}^2 T_s^2 \tag{7}$$

$$n_1 = -\frac{2\zeta_z \omega_{nz} T_s + 2}{\alpha_z} \tag{8}$$

$$n_2 = \frac{1}{\alpha_z} \tag{9}$$

$$d_1 = -\frac{2\zeta_p \omega_{np} T_s + 2}{\alpha_p} \tag{10}$$

$$d_2 = \frac{1}{\alpha_p}. \tag{11}$$

* * * * *